United States Patent
Saito et al.

(10) Patent No.: US 8,803,002 B2
(45) Date of Patent: Aug. 12, 2014

(54) ELECTRONIC DEVICE PREVENTING DAMAGE TO CIRCUIT TERMINAL PORTION AND METHOD OF MANUFACTURING THE SAME

(75) Inventors: Hidetaka Saito, Shiojiri (JP); Kazushige Fujimori, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 267 days.

(21) Appl. No.: 13/238,413

(22) Filed: Sep. 21, 2011

(65) Prior Publication Data

US 2012/0103666 A1    May 3, 2012

(30) Foreign Application Priority Data

Oct. 28, 2010   (JP) ................................ 2010-242595

(51) Int. Cl.
*H05K 1/11* (2006.01)

(52) U.S. Cl.
USPC .......................................................... 174/261

(58) Field of Classification Search
USPC .................. 174/261, 250, 255–257, 267–268
See application file for complete search history.

(56) References Cited

U.S. PATENT DOCUMENTS

| 6,477,031 B1 * | 11/2002 | Hayashi ..................... 361/306.3 |
| 8,399,779 B2 * | 3/2013 | Ogawa et al. ................. 174/262 |
| 2003/0045016 A1 | 3/2003 | Saito et al. |
| 2007/0169136 A1 * | 7/2007 | Hiramatsu et al. ............ 720/658 |

FOREIGN PATENT DOCUMENTS

| JP | U-3072602 | 10/2000 |
| JP | A-2003-45517 | 2/2003 |
| JP | A-2003-152299 | 5/2003 |
| JP | A-2007-52975 | 3/2007 |
| JP | A-2009-75232 | 4/2009 |
| JP | A-2010-16197 | 1/2010 |

* cited by examiner

*Primary Examiner* — Tremesha S Willis
(74) *Attorney, Agent, or Firm* — Oliff PLC (57) ABSTRACT

An electronic device includes a first substrate on which a thin-film circuit layer is provided at a side of a first face, a second substrate on which a wiring layer is provided, and an isotropic conductive material which electrically connects a terminal portion of the thin-film circuit layer and the wiring layer. In the electronic device, the conductive material is film-formed on both the terminal portion and the wiring layer, and at least a portion of the wiring layer is disposed between the conductive material and the circuit layer. When the terminal portion of the thin-film circuit layer and the wiring layer of a connection substrate are electrically connected to each other, the terminal portion is not required to be excessively pressurized and heated. Therefore, the terminal portion can be prevented from being damaged.

12 Claims, 7 Drawing Sheets

ELECTRONIC DEVICE PREVENTING DAMAGE TO CIRCUIT TERMINAL PORTION AND METHOD OF MANUFACTURING THE SAME

BACKGROUND

1. Technical Field

The present invention relates to an electronic device and a method of manufacturing the electronic device.

2. Related Art

A thin-film circuit device has a thin-film circuit layer including a semiconductor element and the like on the surface of a substrate. A single-crystal silicon wafer, a quartz glass substrate, a heat resistant glass substrate, a resin film, or the like is used as the substrate. An appropriate material is selected for a substrate depending on performances and functions of a required thin-film circuit device. In a thin-film circuit device in which the resin film is used for the substrate among them, the substrate itself is thin and flexible. Therefore, if the resin film is used for the substrate, a thin-film circuit device which is lightweight and has flexibility can be provided.

As a method of manufacturing the thin-film circuit device in which the resin film is used for the substrate, the following methods have been proposed. That is, a method of obtaining a thin-film circuit layer by laminating a semiconductor layer, a dielectric layer, a metal layer and the like in order on the resin film, a method of separating a thin-film circuit layer which has been previously formed on the surface of a heat resistant substrate, such as a glass substrate, from the substrate and bonding the thin-film circuit layer onto the resin film through an adhesive, and the like, have been proposed.

In particular, as a method of manufacturing a display module called an electronic paper which has been recently focused on as a novel electronic device, specifically, a method in which a microcapsule-type electrophoretic material and a thin-film circuit layer are combined on the resin film so as to provide a flexible electrophoretic display having high performance has been proposed.

When the thin-film circuit layer provided on the resin film is used as a driving circuit for a display element, it is necessary that a substrate for external connection (hereinafter, also referred to as "connection substrate" simply) be bonded to the thin-film circuit layer such that a power, a signal, and the like can be externally input to the thin-film circuit layer.

In this case, when the thin-film circuit layer and the connection substrate are bonded to each other, an anisotropic conductive material (for example, an Anisotropic Conductive Film (ACF), an Anisotropic Conductive Paste (ACP), or the like) is used in many cases. The thin-film circuit layer and the connection substrate are electrically connected to each other with conductive particles contained in the anisotropic conductive material (for example, see, JP-A-2009-75232).

To be more specific, the surface of a circuit substrate formed with a resin film and a surface of a connection substrate are opposed to each other. Further, an anisotropic conductive material containing conductive particles is interposed between a terminal portion of a thin-film circuit layer and a wiring layer. The thin-film circuit layer is provided on the surface of the circuit substrate. The wiring layer is provided on the surface of the connection substrate. Then, the circuit substrate and the connection substrate are positioned on a stage in a state where the anisotropic conductive material is sandwiched therebetween. Further, a portion on which the terminal portion and the wiring layer are overlapped with each other is pressurized and heated. With this, the terminal portion and the wiring layer are electrically connected to each other through the conductive particles.

However, in an existing connection method, the conductive particles are strongly pressed against the terminal portion by the pressurization when the terminal portion and the wiring layer are connected to each other. The terminal portion is formed by a thin film such as Indium Tin Oxide (ITO), for example. Therefore, there has been a risk that the terminal portion is damaged if the conductive particles are strongly pressed against the terminal portion.

SUMMARY

An advantage of some aspects of the invention is to provide an electronic device in which a terminal portion of a thin-film circuit layer and a wiring layer of another substrate can be electrically connected to each other while preventing the terminal portion from being damaged and a method of manufacturing the electronic device.

An electronic device according to an aspect of the invention includes a first substrate on which a thin-film circuit layer is provided at a side of a first face, a second substrate, a wiring layer which is provided on a second face as a main face of the second substrate, and a conductive portion which includes an isotropic conductive material for electrically connecting a terminal portion of the thin-film circuit layer and the wiring layer. In the electronic device, the conductive material is in film-formed on the terminal portion to on the wiring layer. As the "isotropic conductive material", Ag paste can be recited, for example. Further, such conductive material is film-formed by a method such as printing, an ink jet method, plating, deposition, or coating, for example.

With this configuration, when the terminal portion of the thin-film circuit layer and the wiring layer of the connection substrate are electrically connected to each other, the terminal portion is not required to be excessively pressurized and heated. For example, the terminal portion and the wiring layer are not required to be bonded to each other at a high pressure and a high temperature as are applied in a case of using an anisotropic conductive material. Since an excessive load is not placed on the terminal portion of the thin-film circuit layer, the terminal portion can be prevented from being damaged. Therefore, increase in a connection resistance and a connection failure between the thin-film circuit layer and the wiring layer can be prevented. This makes it possible to contribute to improve yield and reliability of the electronic device. It is to be noted that the "first substrate" corresponds to a circuit substrate, which will be described later, for example. Further, the "second substrate" corresponds to a connection substrate, which will be described later, for example. The "first face" corresponds to a surface of the circuit substrate, which will be described later.

Further, in the electronic device according to another aspect of the invention, it is preferable that the wiring layer include an extending portion which extends from the second substrate to the first substrate, the extending portion be overlapped with the terminal portion at the side of the first face, and the conductive material be film-formed so as to cover a portion of the extending portion, which is overlapped with the terminal portion. With this configuration, the terminal portion of the thin-film circuit and the wiring layer of the connection substrate make direct contact with each other. Therefore, a connection resistance between the terminal portion and the wiring layer can be reduced in comparison with a case where the terminal portion and the wiring layer are electrically connected to each other through the conductive material only.

Further, in the electronic device according to another aspect of the invention, it is preferable that an outer circumference of the portion of the extending portion, which is overlapped with the terminal portion, have a concave portion when seen from above, and the conductive material be film-formed so as to fill up the concave portion. With this configuration, a contact area between the terminal portion and the conductive material can be increased. Therefore, a bonding force between the terminal portion and the conductive material can be enhanced.

Further, in the electronic device according to another aspect of the invention, it is preferable that the portion of the extending portion, which is overlapped with the terminal portion, have a through-hole of which bottom side is the terminal portion, and the conductive material be film-formed so as to fill up the through-hole, With this configuration, a contact area between the terminal portion and the conductive material can be increased. Therefore, a bonding force between the terminal portion and the conductive material can be enhanced.

Further, in the electronic device according to another aspect of the invention, it is preferable that the second substrate have a third face which is located at a side opposite to the second face and a fourth face which is located between the second face and the third face, the fourth face be formed in a tapered shape so as to intersect with the second face at a wide angle and intersect with the third face at an acute angle when seen in the cross section, the first substrate and the second substrate be arranged such that the fourth face is located on the first face, and the conductive material be film-formed along the fourth face.

With this configuration, it is easy to film-form the conductive material so as to have equal to or larger than a constant thickness on the fourth face. That is to say, a film formation characteristic of the conductive material on the fourth face can be improved. Therefore, the conductive material can be prevented from being disconnected. It is to be noted that, in the embodiment, the "second face" corresponds to a surface of the connection substrate, which will be described later. The "third face" corresponds to a back face of the connection substrate, which will be described later. The "fourth face" corresponds to a side face of the connection substrate, which will be described later.

Further, in the electronic device according to another aspect of the invention, it is preferable that the first substrate have a fifth face which is located at a side opposite to the first face and a sixth face which is located between the first face and the fifth face, the sixth face be formed in a tapered shape so as to intersect with the first face at a wide angle and intersect with the fifth face at an acute angle when seen in the cross section, the first substrate and the second substrate be arranged such that the sixth face is located on the second face, and the conductive material be film-formed along the sixth face.

With this configuration, it is easy to film-form the conductive material so as to have equal to or larger than a constant thickness on the sixth face. That is to say, a film formation characteristic of the conductive material on the sixth face can be improved. Therefore, the conductive material can be prevented from being disconnected. It is to be noted that the "fifth face" corresponds to a back face of the circuit substrate, which will be described later. The "sixth face" corresponds to a side face of the circuit substrate, which will be described later.

Further, in the electronic device according to another aspect of the invention, it is preferable that the electronic device further include an adhesive which bonds the first substrate and the second substrate. With this configuration, the first substrate and the second substrate are bonded to each other with the adhesive. Therefore, even if a force of moving the second substrate relative to the first substrate is applied from the outside, the force focusing on the isotropic conductive material can be prevented.

Further, a method of manufacturing an electronic device according to another aspect of the invention includes a process of electrically connecting a terminal portion of a thin-film circuit layer which is provided on a first substrate at a side of a first face and a wiring layer which is provided on a second face as a main face of a second substrate by film-forming an isotropic conductive material from on the terminal portion to on the wiring layer. With this method, when the terminal portion and the wiring layer are electrically connected to each other, an excessive load is not placed on the terminal portion of the thin-film circuit layer. Therefore, the terminal portion can be prevented from being damaged. Accordingly, increase in a connection resistance and a connection failure between the thin-film circuit layer and the wiring layer can be prevented. This makes it possible to contribute to improve yield and reliability of the electronic device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention are described with reference to drawings. It is to be noted that in the drawings described as follows, the same reference numerals denote parts having the same configurations and overlapped description thereof is not repeated.

First Embodiment

Figure 1:
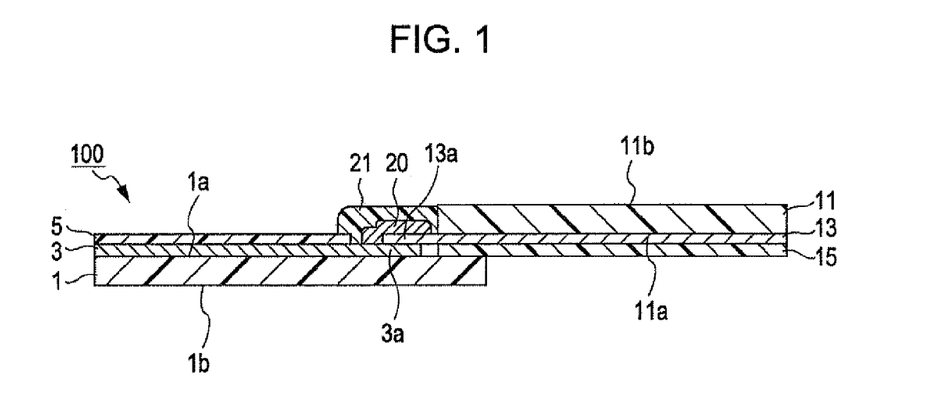
FIG. 1 is a view illustrating a configuration example of an electronic device according to a first embodiment.

FIG. 1 is a cross-sectional view illustrating a configuration example of an electronic device 100 according to the first embodiment of the invention. As illustrated in FIG. 1, the electronic device 100 includes a circuit substrate 1, a connection substrate 11, an isotropic conductive material (that is, conductive portion) 20, and a resin cover 21. A thin-film circuit layer 3 is provided on the circuit substrate 1 at a side of a surface 1a. A wiring layer 13 is provided on the connection substrate 11 at a side of a surface 11a as a main face. The isotropic conductive material 20 electrically connects a terminal portion 3a of the thin-film circuit layer 3 and the wiring layer 13 of the connection substrate 11. The resin cover 21 covers the conductive material 20. In the embodiment, the surface 1a of the circuit substrate 1 faces upward and the surface 11a of the connection substrate 11 faces downward. In this state, a part of the connection substrate 11 is arranged on the surface 1a of the circuit substrate 1. Next, each configuration as illustrated in FIG. 1 is described in detail.

The circuit substrate 1 is formed by a resin film such as polyimide, for example. The circuit substrate 1 is thin and a thickness thereof is 100 to 500 µm, for example. Further, the circuit substrate 1 is lightweight and has flexibility. The thin-film circuit layer 3 formed by a thin film transistor (TFT) or the like, for example, is provided on the circuit substrate 1 formed by the resin film at the side of the surface 1a. The thin-film circuit layer 3 is directly formed on the surface 1a of the circuit substrate 1, for example. Alternatively, the thin-film circuit layer 3 may be bonded to the surface 1a of the circuit substrate 1 through an adhesive (not illustrated). Further, the thin-film circuit layer 3 excluding the terminal portion 3a is covered by a protection film 5 formed by a solder resist, for example. It is to be noted that the terminal portion 3a is formed with a conductive material such as ITO, for example. The thickness of the terminal portion 3a is 0.1 to 1 µm, for example.

On the other hand, the connection substrate 11 is a substrate for connecting the terminal portion 3a of the thin-film circuit layer 3 to the outside of the circuit substrate 1 (alternatively, for drawing the terminal portion 3a to the outside). The connection substrate 11 is formed by a resin film such as polyimide, for example. The connection substrate 11 is thin and a thickness thereof is 10 to 100 µm, for example. Further, the connection substrate 11 is lightweight and has flexibility. The wiring layer 13 formed with copper foil or the like, for example, is formed on the connection substrate 11 at the side of the surface 11a. The thickness of the wiring layer 13 is 5 to 25 µm, for example. In the embodiment, the wiring layer 13 extends onto the surface 1a of the circuit substrate 1 from the surface 11a of the connection substrate 11. The portion 13a which extends (hereinafter, also referred to as "extending portion") is overlapped with the terminal portion 3a of the thin-film circuit layer 3. Further, the wiring layer 13 excluding the extending portion 13a is covered by a protection film 15 formed by a solder resist, for example.

Further, the isotropic conductive material 20 is formed with Ag paste, for example. The resin cover 21 is formed by a mold resin, for example. The conductive material 20 can be separated from the air and water by covering the conductive material 20 with the resin cover 21. This makes it possible to prevent the conductive material 20 from being oxidized and corroded.

Figure 2:
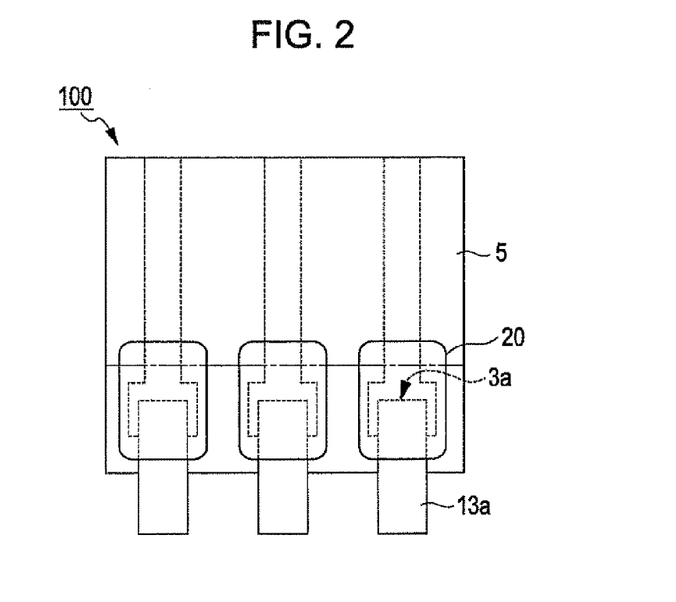
FIG. 2 is a view illustrating an example of positions at which isotropic conductive materials are formed.

FIG. 2 is a plan view illustrating an example of positions at which the isotropic conductive materials 20 are formed. In FIG. 2, the resin cover 21 is not illustrated in order for the drawing not being complicated. As illustrated in FIG. 2, the terminal portions 3a of the thin-film circuit layer and the extending portions 13a of the wiring layer of the connection substrate are overlapped with each other at a ratio of 1:1 (that is, a ratio at which one terminal portion 3a corresponds to one extending portion 13a), for example. Further, the conductive materials 20 are film-formed so as to cover portions on which the terminal portions 3a and the extending portions 13a are overlapped with each other. The conductive materials 20 are film-formed in this manner so that the extending portions 13a and the terminal portions 3a are connected to each other directly in a close contact manner and are also connected to each other indirectly through the conductive materials 20. Next, a method of manufacturing the electronic device 100 is described.

Figure 3A:
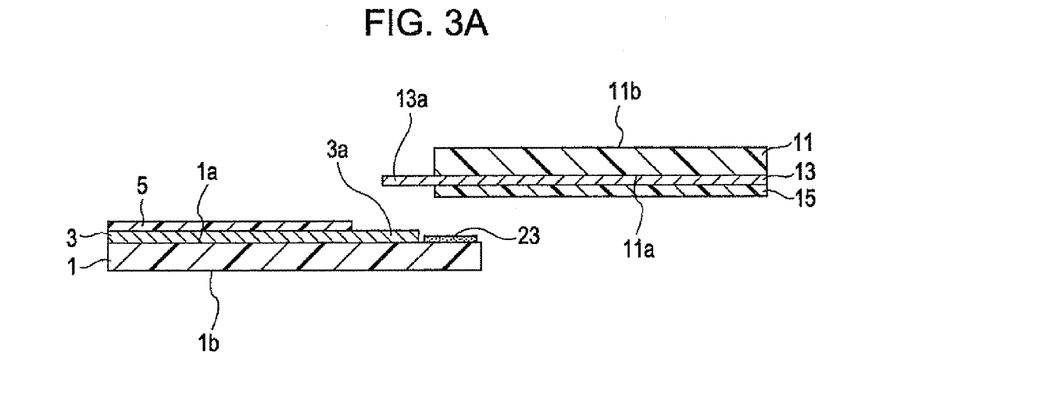
FIGS. 3A to 3C are views illustrating a method of manufacturing the electronic device according to the first embodiment.
Figure 3B:
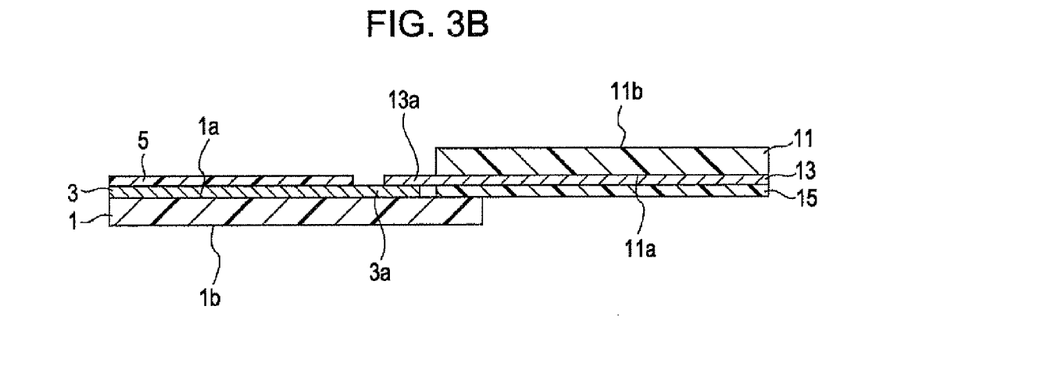
Figure 3C:
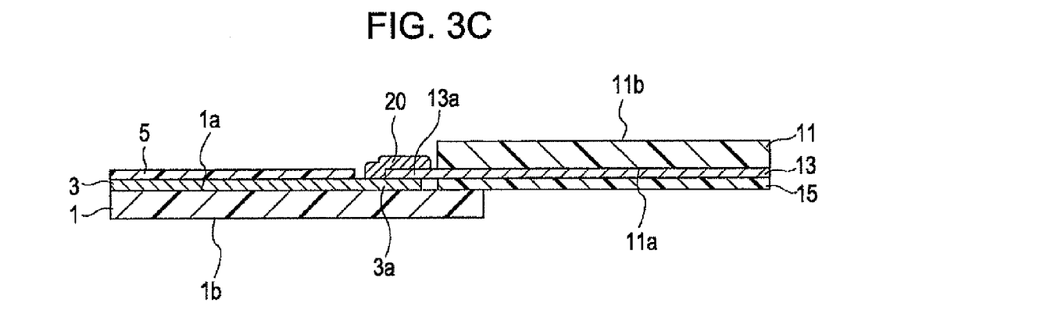

FIGS. 3A to 3C are process views illustrating the method of manufacturing the electronic device 100 according to the first embodiment of the invention.

In FIG. 3A, the circuit substrate 1 on which the thin-film circuit layer 3 is provided at the side of the surface 1a and the protection film 5 is formed on the thin-film circuit layer 3 is prepared, at first. Further, the connection substrate 11 on which the wiring layer 13 is provided at the side of the surface 11a is prepared before or after, or in parallel with the preparation of the circuit substrate 1.

Next, a part of the connection substrate 11 is arranged on the surface 1a of the circuit substrate 1, as illustrated in FIG. 3B. To be more specific, a part of the connection substrate 11 is arranged on the surface 1a in a state where the side of the surface 1a of the circuit substrate 1 and the side of the surface 11a of the connection substrate 11 are opposed and positionally adjusted to each other. It is to be noted that as illustrated in FIG. 3A, an adhesive 23 may be interposed between the circuit substrate 1 and the connection substrate 11 so as to adhere the circuit substrate 1 and the connection substrate 11 to each other with the adhesive 23. It is desirable that a silicon-based adhesive having flexibility to be bent at some degree is used as the adhesive 23, for example.

If the circuit substrate 1 and the connection substrate 11 are temporarily fixed to each other with the adhesive 23, a film formation position of the conductive material 20 can be prevented from being largely out of position in a film formation process of the conductive material 20, which will be described later. Further, the adhesive 23 may be left as it is after the film formation process of the conductive material 20 is finished (that is, after the temporal fixing is finished). Therefore, the circuit substrate 1 and the connection substrate 11 are continued to be bonded to each other with the adhesive 23 after the electronic device 100 has been completely manufactured. Accordingly, even if a force of separating the circuit substrate 1 and the connection substrate 11 from each other is applied from the outside, the force focusing on the conductive material 20 can be prevented.

Next, as illustrated in FIG. 3C, the isotropic conductive material 20 formed with the Ag paste or the like is film-formed so as to cover the portion on which the terminal portion 3a of the thin-film circuit layer 3 and the extending portion 13a of the wiring layer 13 are overlapped with each other. As a method of film-forming the conductive material 20, a method such as printing, an ink jet method, plating, deposition, or coating is exemplified. With such film formation method, since an excessive load is not placed on the terminal portion 3a of the thin-film circuit layer 3, the terminal portion 3a can be prevented from being damaged. Thereafter, the resin cover 21 is formed so as to cover the conductive material 20. With this, the electronic device 100 as illustrated in FIG. 1 is completed.

As described above, according to the first embodiment of the invention, when the terminal portion 3a of the thin-film circuit layer 3 and the wiring layer 13 of the connection substrate 11 are electrically connected to each other, the terminal portion 3a is not required to be excessively pressurized and heated. For example, the terminal portion 3a and the wiring layer 13 are not required to be bonded to each other at a high pressure and a high temperature as are applied in a case of using an anisotropic conductive material. Since an excessive load is not placed on the terminal portion 3a of the thin-film circuit layer 3, the terminal portion 3a can be prevented from being damaged. Therefore, increase in a connection resistance and a connection failure between the thin-film circuit layer 3 and the wiring layer 13 can be prevented. This makes it possible to contribute to improve yield and reliability of the electronic device.

Second Embodiment

In the above first embodiment, a case where a part of the connection substrate 11 is arranged on the surface 1a of the circuit substrate 1 has been described. However, in the invention, a position relationship between the circuit substrate 1 and the connection substrate 11 is not limited thereto. In the invention, the connection substrate 11 may not be arranged on the surface 1a of the circuit substrate 1, for example.

Figure 4A:
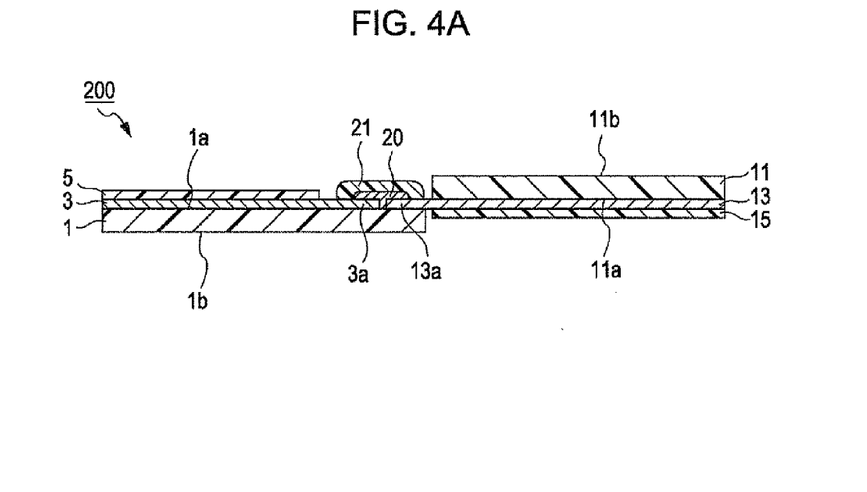
FIGS. 4A and 4B are views illustrating a configuration example of an electronic device according to a second embodiment.
Figure 4B:
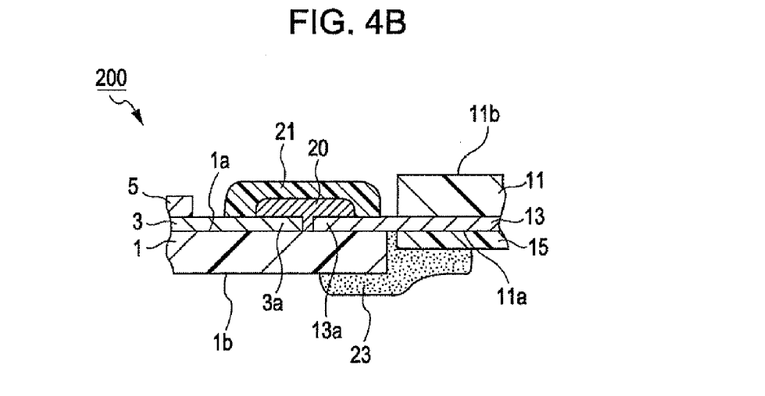

FIG. 4A is a cross-sectional view illustrating a configuration example of an electronic device 200 according to the second embodiment of the invention. FIG. 43 is a cross-sectional view illustrating the electronic device 200 in a partially enlarged manner.

As illustrated in FIG. 4A, in the embodiment, the circuit substrate 1 and the connection substrate 11 are arranged so as to be separated from each other. To be more specific, the circuit substrate 1 and the connection substrate 11 are arranged in a state where the surface 1a of the circuit substrate 1 faces upward and the surface 11a of the connection substrate 11 faces downward. The wiring layer 13 which is provided on the connection substrate 11 at the side of the surface 11a extends onto the surface 1a of the circuit substrate 1 from the surface 11a. Further, the portion 13a which extends (that is, also referred to as "extending portion") is arranged on the surface 1a of the circuit substrate 1 at the same height as the terminal portion 3a of the thin-film circuit layer 3. That is to say, the extending portion 13a is not overlapped with the terminal portion 3a. Further, the isotropic conductive material 20 is in film-formed from on the extending portion 13a to on the terminal portion 3a. The extending portion 13a and the terminal portion 3a are electrically connected to each other with the conductive material 20.

Even in such case, the terminal portion 3a and the wiring layer 13 can be electrically connected to each other by film-forming the conductive material 20 by the method such as printing, ink jet method, plating, deposition, or coating, for example, as in the same manner as the first embodiment. With the film formation method, since an excessive load is not placed on the terminal portion 3a, the terminal portion 3a can be prevented from being damaged. Therefore, increase in a connection resistance and a connection failure between the thin-film circuit layer 3 and the wiring layer 13 can be prevented.

Further, in the second embodiment, the connection substrate 11 is not arranged on the surface 1a of the circuit substrate 1 unlikely the case in the first embodiment. Therefore, the electronic device can be made thinner. To be more specific, as is seen from comparison between FIG. 1 and FIG. 4A, in the second embodiment, the electronic device can be made thinner by the thickness of the protection film 15 in comparison with that in the first embodiment.

It is to be noted that in the second embodiment, the circuit substrate 1 and the connection substrate 11 may be also bonded to each other with an adhesive. For example, as illustrated in. FIG. 4B, the adhesive 23 may be coated over from a back face (that is, face located at the side opposite to the surface) 1b of the circuit substrate 1 to the surface 11a of the connection substrate 11. With this, the same effects as those obtained by the adhesive 23 described in the first embodiment can be obtained.

Third Embodiment

In the above first embodiment, a case where the wiring layer 13 extends onto the surface of the circuit substrate 1 from the surface of the connection substrate 11 and the portion 13a which extends (that is, extending portion) is overlapped with the terminal portion 3a has been described. However, a mode of the wiring layer 13 is not limited thereto in the invention. In the invention, the wiring layer 13 may not extend to the outer side of the connection substrate 11.

Figure 5A:
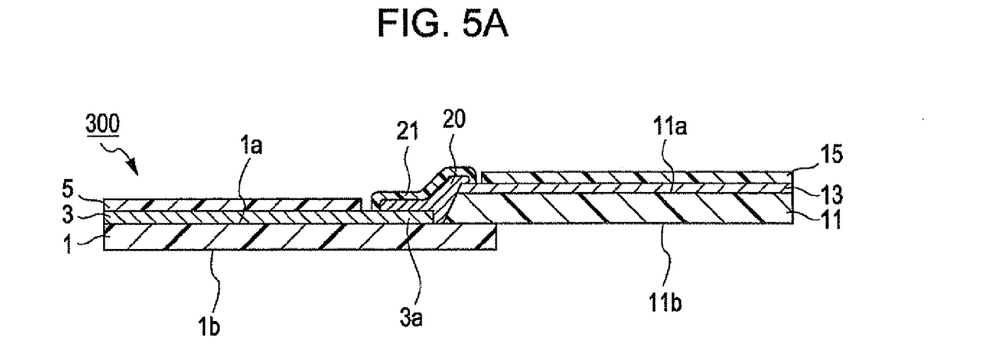
FIGS. 5A and 5B are views illustrating a configuration example of an electronic device according to a third embodiment.
Figure 5B:
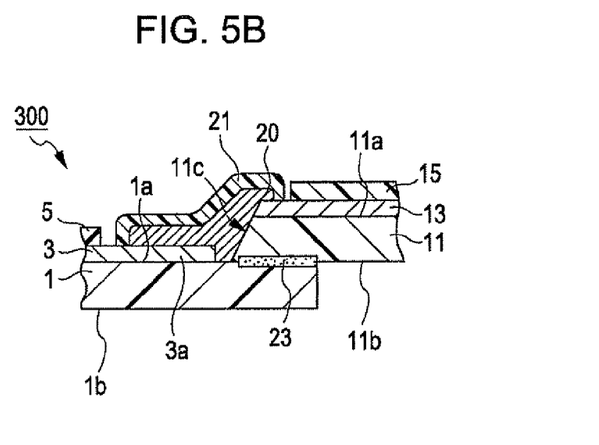

FIG. 5A is a cross-sectional view illustrating a configuration example of an electronic device 300 according to the third embodiment of the invention. FIG. 5B is a cross-sectional view illustrating the electronic device 300 in a partially enlarged manner.

As illustrated in FIG. 5A, in the embodiment, a part of the connection substrate 11 is arranged on the surface 1a of the circuit substrate 1 in a state where the surface 1a of the circuit substrate 1 faces upward and the surface 11a of the connection substrate 11 also faces upward. That is to say, a part of the connection substrate 11 is arranged on the surface 1a of the circuit substrate 1 in a state where the surface 1a of the circuit substrate 1 and the surface 11a of the connection substrate 11 faces the same direction. The wiring layer 13 does not extend to the outer side of the connection substrate 11. Further, the isotropic conductive material 20 is in film-formed from on the terminal portion 3a to on the wiring layer 13. The wiring layer 13 and the terminal portion 3a are electrically connected to each other with the conductive material 20.

Even in such case, the terminal portion 3a and the wiring layer 13 can be electrically connected to each other by film-forming the conductive material 20 using the method such as printing, ink jet method, plating, deposition, or coating, for example, as in the same manner as the first and second embodiments. With the film formation method, since an excessive load is not placed on the terminal portion 3a, the terminal portion 3a can be prevented from being damaged. Therefore, increase in a connection resistance and a connection failure between the thin-film circuit layer 3 and the wiring layer 13 can be prevented.

Further, in the third embodiment, as illustrated in FIG. 5B, it is desirable that at least a face on which the conductive material 20 is film-formed among side faces (that is, face located between the surface and the back face) 11c of the connection substrate 11 is formed in a tapered shape so as to face upward. That is to say, it is desirable that the above side face 11c is formed in a tapered shape so as to intersect with the surface 11a of the connection substrate 11 at a wide angle and intersect with the back face 11b at an acute angle. In FIG. 5B, the circuit substrate 1 and the connection substrate 11 are arranged such that the tapered side face 11c is located on the surface 1a of the circuit substrate 1. Further, the conductive material 20 is film-formed along the side face 11c.

With this configuration, it is easy to film-form the conductive material 20 so as to have equal to or larger than a constant thickness on the side face 11c of the connection substrate 11. That is to say, a film formation characteristic of the conductive material 20 on the side face 11c can be improved. Therefore, the conductive material 20 can be prevented from being disconnected.

In addition, in the third embodiment, the circuit substrate 1 and the connection substrate 11 may be also bonded to each other with an adhesive. For example, as illustrated in FIG. 5B, the adhesive 23 may be coated between the surface 1a of the circuit substrate 1 and the back face 11b of the connection substrate 11. With this, the same effects as those obtained by the adhesive 23 described in the first embodiment can be obtained.

Fourth Embodiment

Further, in the invention, a part of the connection substrate 11 may not be arranged on the circuit substrate 1 and a part of the circuit substrate 1 may be arranged on the connection substrate 11, alternatively.

Figure 6A:
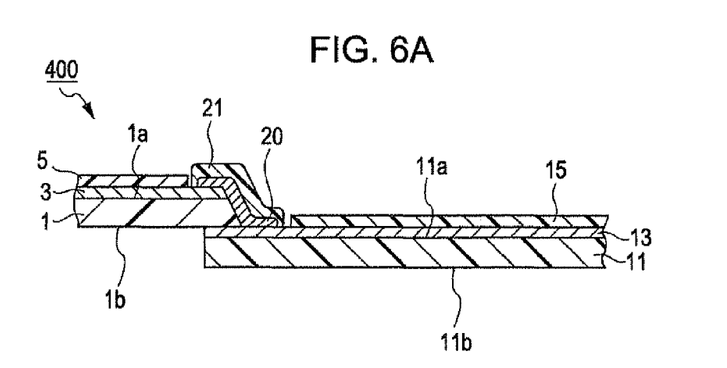
FIGS. 6A to 6C are views illustrating a configuration example of an electronic device according to a fourth embodiment.
Figure 6B:
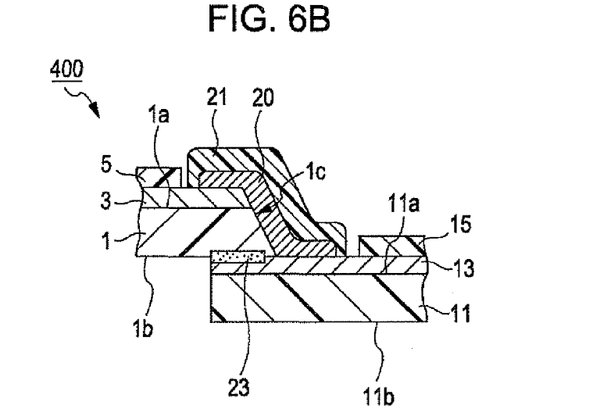
Figure 6C:
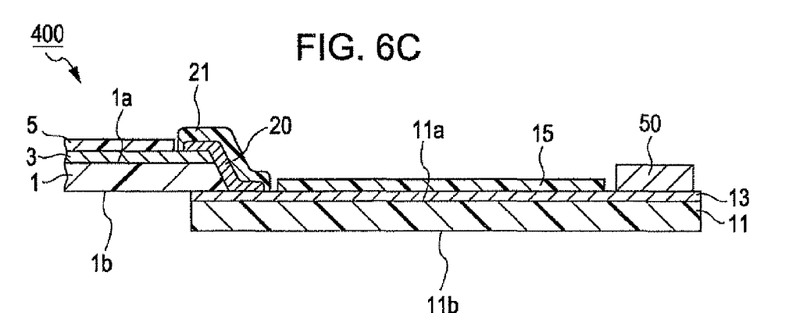

FIG. 6A is a cross-sectional view illustrating a configuration example of an electronic device 400 according to the fourth embodiment of the invention. FIG. 6B is a cross-sectional view illustrating the electronic device 400 in a partially enlarged manner. FIG. 6C is a cross-sectional view illustrating another configuration example of the electronic device 400.

As illustrated in FIG. 6A, in the embodiment, a part of the circuit substrate 1 is arranged on the surface 11a of the connection substrate 11 in a state where the surface 1a of the circuit substrate 1 faces upward and the surface 11a of the connection substrate 11 also faces upward. The wiring layer 13 does not extend to the outer side of the connection substrate 11. Further, the isotropic conductive material 20 is in film-formed from on the terminal portion 3a to on the wiring layer 13. The wiring layer 13 and the terminal portion 3a are electrically connected to each other with the conductive material 20. Even in such case, when the wiring layer 13 and the terminal portion 3a are electrically connected to each other, an excessive load is not placed on the terminal portion 3a of the thin-film circuit as in the first to third embodiments. Therefore, the terminal portion 3a can be prevented from being damaged. Accordingly, increase in a connection resistance and a connection failure can be prevented.

Further, in the fourth embodiment, as illustrated in FIG. 6B, it is desirable that at least a face on which the conductive material 20 is film-formed among the side faces 1c of the circuit substrate 1 is formed in a tapered shape so as to face upward. That is to say, it is desirable that the above side face 1c is formed in a tapered shape so as to intersect with the surface 1a of the circuit substrate 1 at a wide angle and intersect with the back face 1b at an acute angle. In FIG. 6B, the circuit substrate 1 and the connection substrate 11 are arranged such that the tapered side face is located on the surface 11a of the connection substrate 11. Further, the conductive material 20 is film-formed along the side face 1c. With this configuration, a film formation characteristic of the conductive material 20 on the side face 1c can be improved as in the third embodiment. Therefore, the conductive material 20 can be prevented from being disconnected.

In addition, in the fourth embodiment, the circuit substrate 1 and the connection substrate 11 may be also bonded to each other with an adhesive. For example, as illustrated in FIG. 6B, the adhesive 23 may be coated between the surface 11a of the connection substrate 11 and the back face 1b of the circuit substrate 1. With this configuration, the same effects as those obtained by the adhesive 23 as described in the first embodiment can be obtained.

Further, in the fourth embodiment, as illustrated in FIG. 6C, for example, an electronic part 50 such as a semiconductor chip (IC) and a crystal oscillator may be attached onto the surface 11a of the connection substrate 11. That is to say, the connection substrate 11 may be used not only for the substrate for connection (or relay) but also for the substrate for mounting. In this case, the thin-film circuit layer 3 and the electronic part 50 can be electrically connected to each other through the isotropic conductive material 20 and the wiring layer 13. With this, an electronic device in which the circuit substrate 1 having the thin-film circuit layer 3 and the electronic part 50 are mounted on the surface 11a of the connection substrate (in the embodiment, mounting substrate) 11 can be provided.

Fifth Embodiment

Further, in the invention, in the above first and second embodiments, a shape of the portion of the extending portion 13a of the wiring layer 13, which is overlapped with the terminal portion 3a of the thin-film circuit layer 3, may be devised so as to enhance adhesion of the conductive resin.

Figure 7A:
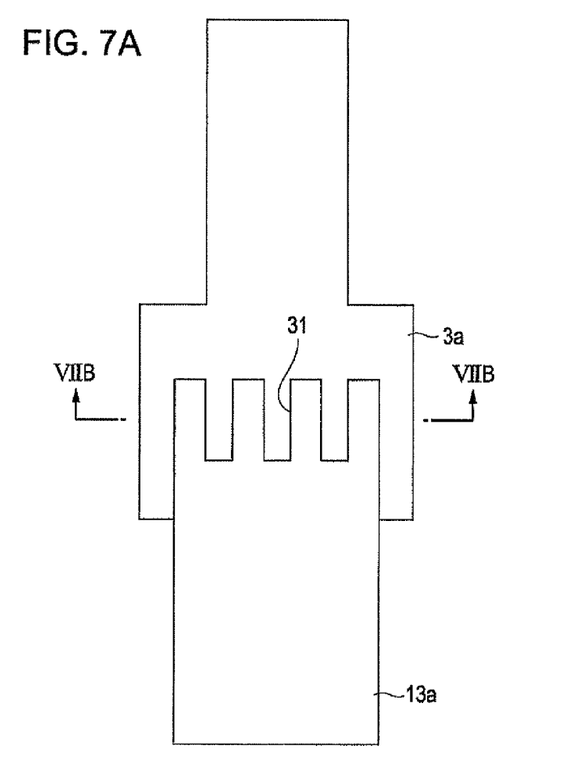
FIGS. 7A and 7B are views illustrating an example of a shape of an extending portion (first example).
Figure 7B:
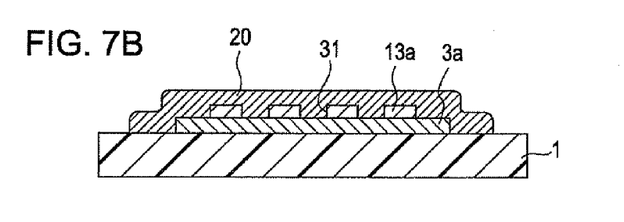
Figure 8A:
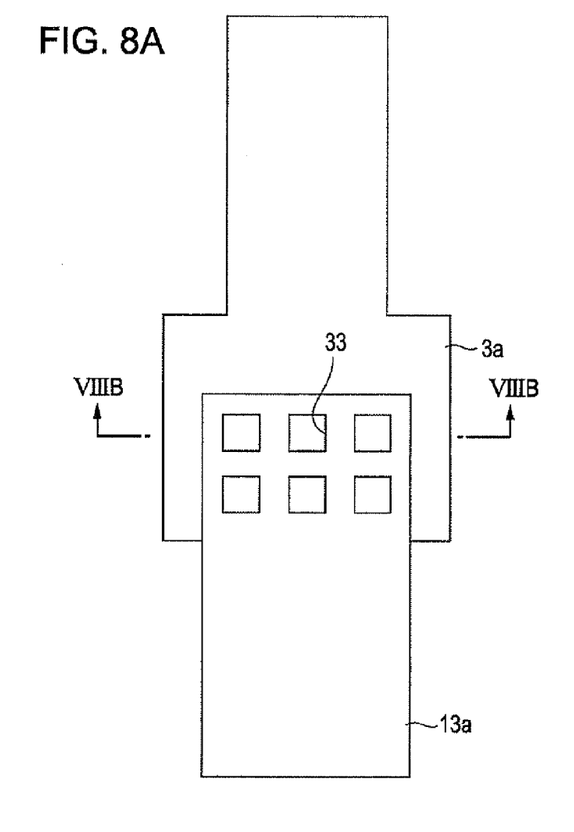
FIGS. 8A and 8B are views illustrating an example of a shape of the extending portion (second example).
Figure 8B:
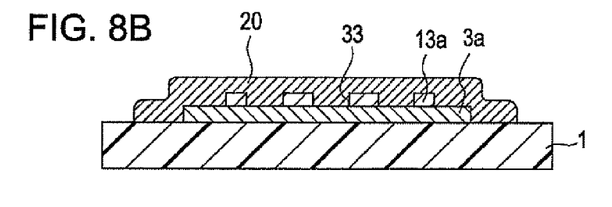

FIG. 7A to FIG. 8B are plan views illustrating an example of a shape of the extending portion 13a. It is to be noted that in FIG. 7A and FIG. 8A, the conductive material 20 is not illustrated in order for the drawings not being complicated. For example, as illustrated in FIGS. 7A and 7B, an outer circumference of the portion of the extending portion 13a, which is overlapped with the terminal portion 3a, may have concave portions 31 when seen from above. Further, the conductive material 20 may be film-formed so as to fill up the concave portions 31. Alternatively, as illustrated in FIGS. 8A and 8B, the portion of the extending portion 13a, which is overlapped with the terminal portion 3a, may have through-holes 33 of which bottom sides are the terminal portion 3a. Further, the conductive material 20 may be film-formed so as to fill up the through-holes 33.

In any case, a contact area between the terminal portion 3a and the conductive material 20 is increased. Therefore, a bonding force between the terminal portion 3a and the conductive material 20 can be enhanced.

Others

It is to be noted that a case where both of the circuit substrate 1 and the connection substrate 11 are thin and are formed with the resin film which is lightweight and has flexibility has been described in the above first to fifth embodiments. However, in the invention, types of the circuit substrate 1 and the connection substrate 11 are not limited thereto. The circuit substrate 1 on which the thin-film circuit layer 3 is provided may be a single-crystal silicon wafer, a quartz glass substrate, a heat resistant glass substrate, or the like, for example.

Further, the connection substrate 11 on which the wiring layer 13 is provided may be a solid substrate having no flexibility, such as a glass epoxy prepreg, for example. Even in such case, if the isotropic conductive material 20 is film-formed by the method such as printing, the ink jet method, plating, deposition, or coating, for example, an excessive load is not placed on the terminal portion 3a formed by a thin film such as ITO. Therefore, the terminal 3a can be prevented from being damaged.

The entire disclosure of Japanese Patent Application No. 2010-242595, filed Oct. 28, 2010 is expressly incorporated by reference herein.

What is claimed is:

1. An electronic device comprising: a first substrate on which a thin-film circuit layer is provided on a first face; a second substrate; a wiring layer which is provided on a second face as a main face of the second substrate; and a conductive portion which includes an isotropic conductive material for electrically connecting a terminal portion of the thin-film circuit layer and the wiring layer, wherein the conductive material is film-formed on both the terminal portion and the wiring layer, at least a portion of the wiring layer disposed between the conductive material and the circuit layer, wherein the second substrate has a third face which is located at a side opposite to the second face and a fourth face which is located between the second face and the third face, the fourth face is formed in a tapered shape so as to intersect with the second face at a wide angle and intersect with the third face at an acute angle when seen in the cross section, the first substrate and the second substrate are arranged such that the fourth face is located on the first face, and the conductive material is film-formed along the fourth face.

2. The electronic device according to claim 1, wherein the wiring layer includes an extending portion which extends from the second substrate to the first substrate, the extending portion is overlapped with the terminal portion at the first face, and the conductive material is film-formed so as to cover a portion of the extending portion, which is overlapped with the terminal portion.

3. The electronic device according to claim 2,
wherein an outer circumference of the portion of the extending portion, which is overlapped with the terminal portion, has a concave portion when seen from above, and
the conductive material is film-formed so as to fill up the concave portion.

4. The electronic device according to claim 3, wherein the portion of the extending portion, which is overlapped with the terminal portion, has a through-hole of which at a bottom side is the terminal portion, and the conductive material is film-formed so as to fill up the through-hole.

5. The electronic device according to claim 1,
wherein the first substrate has a fifth face which is located at a side opposite to the first face and a sixth face which is located between the first face and the fifth face,
the sixth face is formed in a tapered shape so as to intersect with the first face at a wide angle and intersect with the fifth face at an acute angle when seen in the cross section, the first substrate and the second substrate are arranged such that the sixth face is located on the second face, and the conductive material is film-formed along the sixth face.

6. The electronic device according to claim 1, further including an adhesive which bonds the first substrate and the second substrate.

7. A method of manufacturing an electronic device comprising electrically connecting a terminal portion of a thin-film circuit layer which is provided on a first substrate at a first face and a wiring layer which is provided on a second face as a main face of a second substrate by film-forming an isotropic conductive material from on the terminal portion to on the wiring layer, the conductive material is film-formed on both the terminal portion and the wiring layer, at least a portion of the wiring layer disposed between the conductive material and the circuit layer; wherein the second substrate has a third face which is located at a side opposite to the second face and a fourth face which is located between the second face and the third face, the fourth face is formed in a tapered shape so as to intersect with the second face at a wide angle and intersect with the third face at an acute angle when seen in the cross section, the first substrate and the second substrate are arranged such that the fourth face is located on the first face, and the conductive material is film-formed along the fourth face.

8. An electronic device comprising: a first substrate on which a thin-film circuit layer is provided on a first face; a second substrate; a wiring layer which is provided on a second face as a main face of the second substrate; and a conductive portion which includes an isotropic conductive material for electrically connecting a terminal portion of the thin-film circuit layer and the wiring layer, wherein the conductive material is film-formed on both the terminal portion and the wiring layer, at least a portion of the wiring layer disposed between the conductive material and the circuit layer, wherein the first substrate has a fifth face which is located at a side opposite to the first face and a sixth face which is located between the first face and the fifth face, the sixth face is formed in a tapered shape so as to intersect with the first face at a wide angle and intersect with the fifth face at an acute angle when seen in the cross section, the first substrate and the second substrate are arranged such that the sixth face is located on the second face, and the conductive material is film-formed along the sixth face.

9. The electronic device according to claim 8, wherein the wiring layer includes an extending portion which extends from the second substrate to the first substrate, the extending portion is overlapped with the terminal portion at the first face, and the conductive material is film-formed so as to cover a portion of the extending portion, which is overlapped with the terminal portion.

10. The electronic device according to claim 9,
wherein an outer circumference of the portion of the extending portion, which is overlapped with the terminal portion, has a concave portion when seen from above, and
the conductive material is film-formed so as to fill up the concave portion.

11. The electronic device according to claim 10, wherein the portion of the extending portion, which is overlapped with the terminal portion, has a through-hole of which at a bottom side is the terminal portion, and the conductive material is film-formed so as to fill up the through-hole.

12. The electronic device according to claim 8, further including an adhesive which bonds the first substrate and the second substrate.

* * * * *